United States Patent
Takiar et al.

(10) Patent No.: US 10,522,489 B1
(45) Date of Patent: Dec. 31, 2019

(54) MANUFACTURING PROCESS FOR SEPARATING LOGIC AND MEMORY ARRAY

(71) Applicant: Western Digital Technologies, Inc., San Jose, CA (US)

(72) Inventors: Hem Takiar, Fremont, CA (US); Michael Mostovoy, San Ramon, CA (US); Emilio Yero, Sunnyvale, CA (US); Gokul Kumar, San Jose, CA (US); Yan Li, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/021,616

(22) Filed: Jun. 28, 2018

(51) Int. Cl.
*H01L 23/00* (2006.01)
*H01L 25/065* (2006.01)

(52) U.S. Cl.
CPC .............. *H01L 24/08* (2013.01); *H01L 24/04* (2013.01); *H01L 24/09* (2013.01); *H01L 24/48* (2013.01); *H01L 24/80* (2013.01); *H01L 24/94* (2013.01); *H01L 25/0657* (2013.01); *H01L 2224/04042* (2013.01); *H01L 2224/08145* (2013.01); *H01L 2224/09515* (2013.01); *H01L 2224/48147* (2013.01); *H01L 2224/48227* (2013.01); *H01L 2224/80203* (2013.01); *H01L 2224/80205* (2013.01); *H01L 2224/80815* (2013.01); *H01L 2225/06562* (2013.01)

(58) Field of Classification Search
CPC ..... H01L 25/0657; H01L 21/08; H01L 24/80; H01L 24/94; H01L 24/48; H01L 24/04; H01L 24/09

See application file for complete search history.

(56) References Cited

U.S. PATENT DOCUMENTS

| 8,947,931 | B1 | 2/2015 | D'Abreu |
| 9,478,487 | B2 * | 10/2016 | Yang ................. H01L 23/49838 |
| 9,761,568 | B2 | 9/2017 | Fang et al. |
| 10,249,587 | B1 * | 4/2019 | Chen ..................... H01L 24/05 |

(Continued)

FOREIGN PATENT DOCUMENTS

| EP | 2102867 B1 | 7/2013 |
| KR | 20150085687 | 7/2015 |
| WO | 2014051729 A2 | 4/2014 |

OTHER PUBLICATIONS

Office Action dated May 15, 2019 in U.S. Appl. No. 16/021,529.

(Continued)

*Primary Examiner* — Joseph C Nicely (74) *Attorney, Agent, or Firm* — Vierra Magen Marcus LLP (57) ABSTRACT

A semiconductor device is disclosed including an integrated memory module. The integrated memory module may include a pair of semiconductor die, which together, operate as a single, integrated flash memory. In one example, the first die may include the memory cell array and the second die may include the logic circuit such as CMOS integrated circuits. In one example, the second die may be flip-chip bonded to the first die. The flip-chip bond pads on the first and second dies may be made small, with a small pitch, to allow a large number of electrical interconnections between the first and second semiconductor dies.

21 Claims, 11 Drawing Sheets

(56) References Cited

U.S. PATENT DOCUMENTS

| | | | |
|---|---|---|---|
| 2005/0263869 A1* | 12/2005 | Tanaka | H01L 21/563 257/686 |
| 2006/0138647 A1 | 6/2006 | Crisp et al. | |
| 2006/0261454 A1* | 11/2006 | Takiar | G06K 19/07732 257/678 |
| 2009/0004776 A1* | 1/2009 | Ye | B82Y 10/00 438/108 |
| 2011/0161583 A1* | 6/2011 | Youn | G11C 7/02 711/115 |
| 2013/0093080 A1* | 4/2013 | Han | H01L 24/85 257/737 |
| 2013/0277831 A1 | 10/2013 | Yoon et al. | |
| 2015/0294958 A1 | 10/2015 | Mallik et al. | |
| 2016/0155724 A1 | 6/2016 | Kim et al. | |
| 2017/0256501 A1 | 9/2017 | Chao et al. | |
| 2017/0323682 A1 | 11/2017 | Tran et al. | |

OTHER PUBLICATIONS

Qiu et al., "Room-Temperature Cu Microjoining with Ultrasonic Bonding of Cone-Shaped Bump", Japanese Journal of Applied Physics, vol. 52, Apr. 22, 2013.
English language Abstract for KR20150085687 published Jul. 24, 2015.
International Search Report and Written Opinion dated Jun. 10, 2019 in International Patent Application No. PCT/US2019/019136.
Response to Office Action filed Jul. 12, 2019 in U.S. Appl. No. 16/021,529.
International Search Report and Written Opinion dated Jun. 10, 2019 in International Patent Application No. PCT/US2019/019127.

* cited by examiner

MANUFACTURING PROCESS FOR SEPARATING LOGIC AND MEMORY ARRAY

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Recently, ultra high density memory devices have been proposed using a 3D stacked memory structure having strings of memory cells formed into layers. One such storage device is sometimes referred to as a Bit Cost Scalable (BiCS) architecture. In addition to the layered memory cells, 3D memory devices include a logic circuit for controlling read/write to the memory cells. The logic circuit, often fabricated using complementary metal-oxide-semiconductor (CMOS) technology, may typically be formed beneath stacked memory layers within a semiconductor wafer.

As the number of memory layers in 3D memory structures increases to meet ever growing memory demands, it is becoming harder to position the logic circuit beneath the 3D memory cell structure. Additionally, process parameters which are optimized for the memory array formation may not be optimized for the logic circuit formation. For example, it is known to anneal the 3D memory cell structure with heat. While advantageous for the memory cell structure, the heat can adversely affect the operation of the logic circuit.

DETAILED DESCRIPTION

The present technology will now be described with reference to the figures, which in embodiments, relate to a semiconductor device including an integrated memory module. The integrated memory module may include a pair of semiconductor die, which together, operate as a single, integrated flash memory. The division of the flash memory functionality between the pair of die in the module may vary in embodiments, but in one example, the first die may include the memory cell array and the second die may include the logic circuit such as CMOS integrated circuits.

In embodiments, the second semiconductor die of the integrated memory module may be smaller than the first semiconductor die, and may be flip-chip bonded to a surface of the first semiconductor die. Where the first semiconductor die includes the memory cell array and some portions of the control logic circuitry, the number of electrical connections between the first and second semiconductor dies may be relatively small, for example on the order of 100 to 1000 such electrical connections. Conversely, where the first semiconductor die includes only the memory cell array, and all of the control logic circuitry is provided on the second semiconductor die, the number of electrical connections between the first and second semiconductor dies may be relatively high, for example on the order of 10,000 to 100,000 or more. The first and second semiconductor dies may be provided with bond pad sizes and pitch to accommodate these different implementations of the first and second semiconductor dies.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25% of a given dimension.

Figure 1:
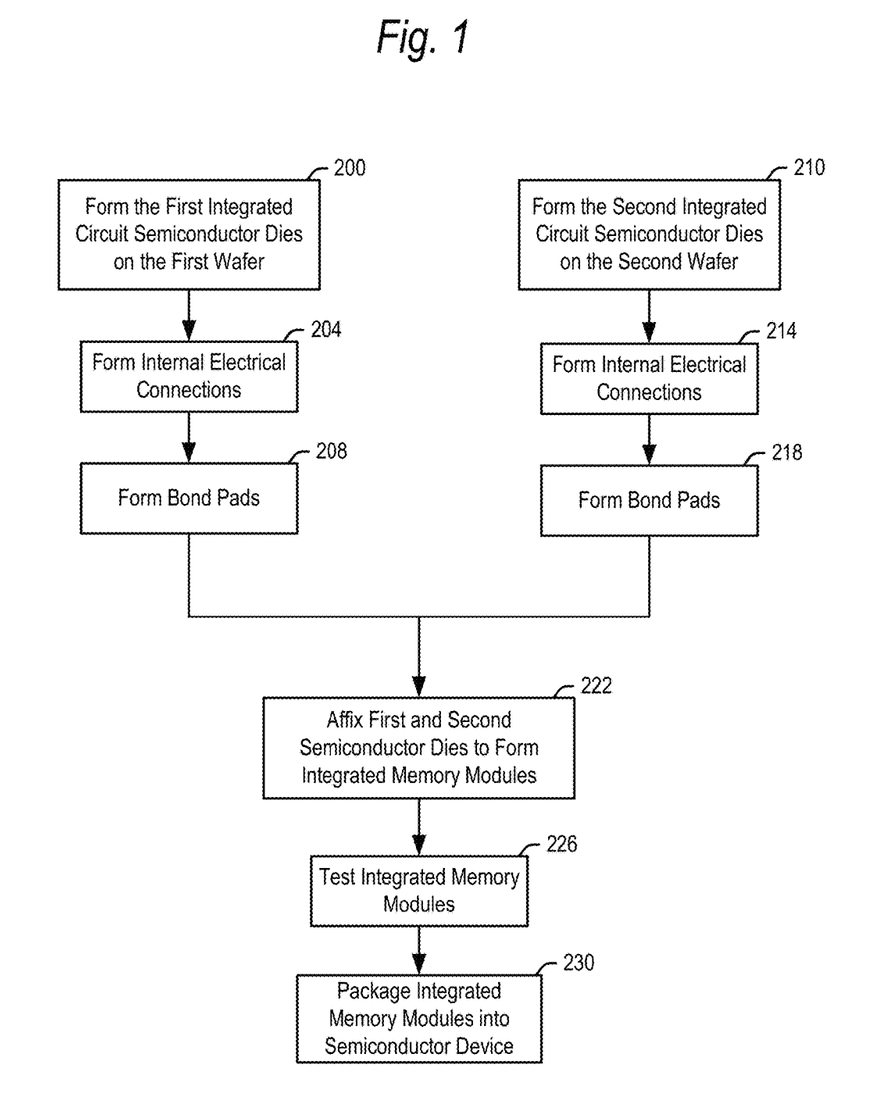
FIG. 1 is a flowchart for forming a semiconductor device according to embodiments of the present technology.
Figure 2:
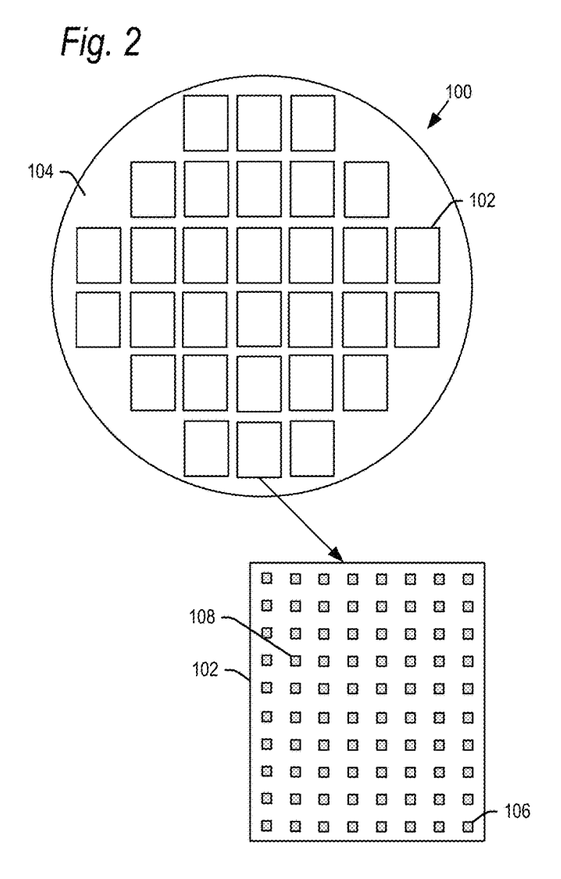
FIG. 2 is a top view of a first semiconductor wafer, and a first semiconductor die therefrom, according to embodiments of the present technology.

An embodiment of the present technology will now be explained with reference to the flowchart of FIG. 1, and the views of FIGS. 2-23. In step 200, a first semiconductor wafer 100 may be processed into a number of first semiconductor dies 102 as shown in FIG. 2. The first semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

The semiconductor wafer 100 may be cut from the ingot and polished on both the first major planar surface 104, and second major planar surface 105 (FIG. 4) opposite surface 104, to provide smooth surfaces. The first major surface 104 may undergo various processing steps to divide the wafer 100 into the respective first semiconductor dies 102, and to form integrated circuits of the respective first semiconductor dies 102 on and/or in the first major surface 104.

Figure 4:
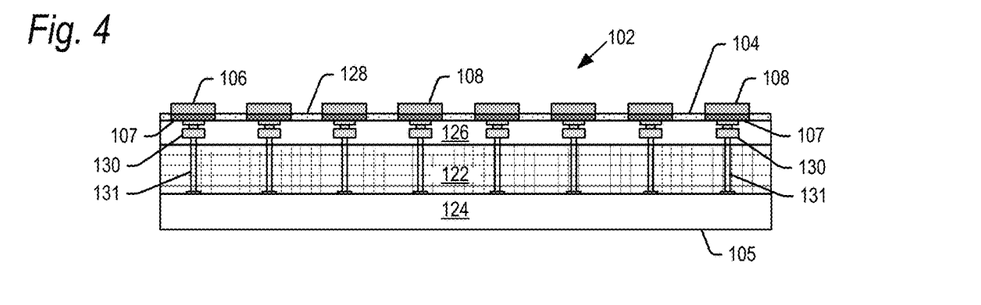
FIG. 4 is a cross-sectional edge view of a first semiconductor die according to embodiments of the present technology.

In particular, in step 200, the first semiconductor die 102 may be processed in embodiments to include integrated circuit memory cell array 122 formed in a dielectric substrate including layers 124 and 126 as shown in the cross-sectional edge view of FIG. 4. In embodiments, the memory cell array 122 may be formed as a 3D stacked memory structure having strings of memory cells formed into layers. However, it is understood that the first semiconductor die 102 may be processed to include integrated circuits other than a 3D stacked memory structure. A passivation layer 128 may be formed on top of the upper dielectric film layer 126.

After formation of the memory cell array 122, internal electrical connections may be formed within the first semiconductor die 102 in step 204. The internal electrical connections may include multiple layers of metal interconnects 130 and vias 131 formed sequentially through layers of the dielectric film 126. As is known in the art, the metal interconnects 130, vias 131 and dielectric film layers 126 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 130 may be formed of a variety of electrically conductive metals including for example copper and copper alloys as is known in the art, and the vias 131 may be lined and/or filled with a variety of electrically conductive metals including for example tungsten, copper and copper alloys as is known in the art.

In step 208, bond pads may be formed on the major planar surface 104 of the first semiconductor dies 102. As shown in FIGS. 2 and 4, these bond pads may include a row of bond pads 106 and flip-chip bond pads 108. As explained below, the flip-chip bond pads 108 are provided for flip-chip bonding to a like pattern of bond pads 118 on a surface of a second semiconductor die 112. As is also explained below, the bond pads 106 are provided for transferring signals between the pair of semiconductor die 102, 112 and a host device.

The passivation layer 128 may be etched, and each bond pad 106, 108 may be formed over a liner 107 in the etched regions of the passivation layer. As is known in the art, the bond pads 106, 108 may be formed for example of copper, aluminum and alloys thereof, and the liner 107 may be formed for example of a titanium/titanium nitride stack such as for example Ti/TiN/Ti, though these materials may vary in further embodiments. The bond pads 106, 108 and liner 107 may be applied by vapor deposition and/or plating techniques. The bond pads and liners together may have a thickness of 720 nm, though this thickness may be larger or smaller in further embodiments. The integrated circuits 122 may be electrically connected to the bond pads 106 and/or 108 by the metal interconnects 130 and vias 131.

FIG. 2 shows semiconductor dies 102 on wafer 100, and bond pads 106, 108 in a grid pattern on one of the semiconductor dies 102. The number of first semiconductor dies 102 shown on wafer 100 in FIG. 2 is for illustrative purposes, and wafer 100 may include more first semiconductor dies 102 than are shown in further embodiments. Similarly, the pattern of bond pads 106, 108, as well as the number of bond pads 106, 108, on the first semiconductor die 102 are shown for illustrative purposes. Each first die 102 may include more bond pads 106, 108 than are shown in further embodiments, and may include various other patterns of bond pads 106, 108.

Figure 3:
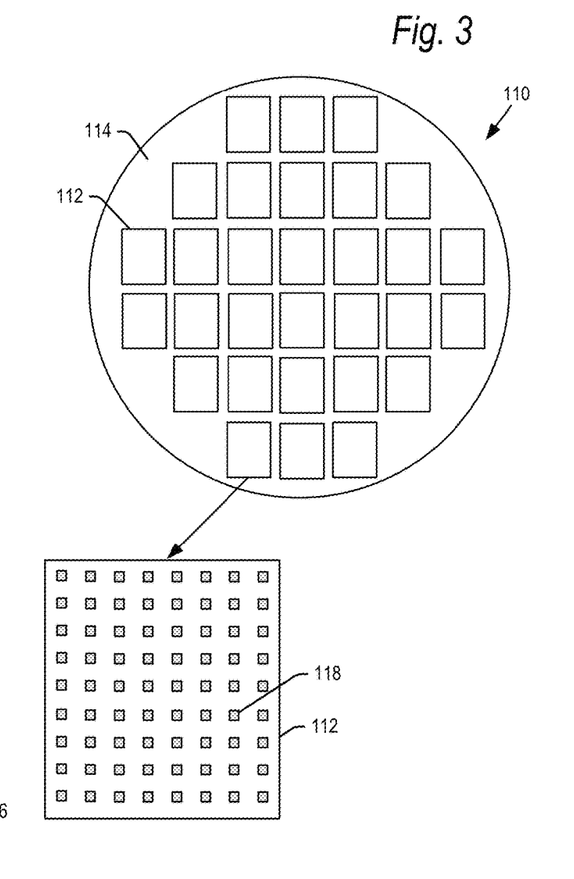
FIG. 3 is a top view of a second semiconductor wafer, and a second semiconductor die therefrom, according to embodiments of the present technology.

Before, after or in parallel with the formation of the first semiconductor dies on wafer 100, a second semiconductor wafer 110 may be processed into a number of second semiconductor dies 112 in step 210 as shown in FIG. 3. The semiconductor wafer 110 may start as an ingot of monocrystalline silicon grown according to either a CZ, FZ or other process. The second semiconductor wafer 110 may be cut and polished on both the first major surface 114, and second major surface 115 (FIG. 5) opposite surface 114, to provide smooth surfaces. The first major surface 114 may undergo various processing steps to divide the second wafer 110 into the respective second semiconductor dies 112, and to form integrated circuits of the respective second semiconductor dies 112 on and/or in the first major surface 114.

Figure 5:
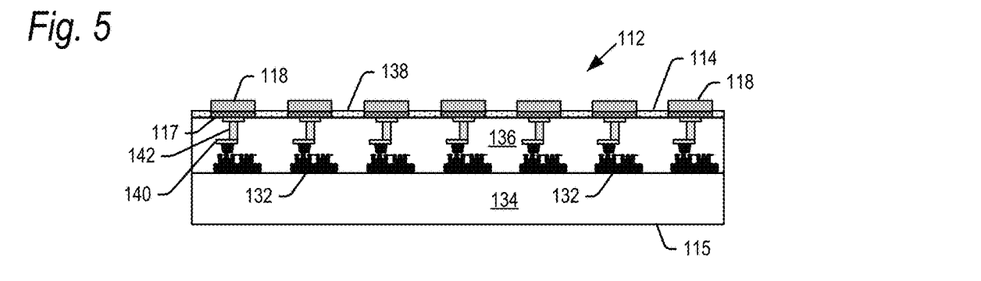
FIG. 5 is a cross-sectional edge view of a second semiconductor die according to embodiments of the present technology.

In one embodiment, the second semiconductor dies 112 may be processed to include integrated circuits 132 formed in a dielectric substrate including layers 134 and 136 as shown in the cross-sectional edge view of FIG. 5. Integrated circuits 132 may be configured as logic circuits to control read/write operations for one or more integrated memory cell arrays. The logic circuits may be fabricated using CMOS technology, though the logic circuits may be fabricated using other technologies in further embodiments. The second semiconductor dies 112 may include other and/or additional integrated circuits in further embodiments as explained below. A passivation layer 138 may be formed on top of the upper dielectric film layer 136.

After formation of the integrated circuits 132, internal electrical connections may be formed within the second semiconductor die 112 in step 214. The internal electrical connections may include multiple layers of metal interconnects 140 and vias 142 formed sequentially through layers of the dielectric film 136. The metal interconnects 140 and vias 142 may be formed of the same materials and in similar processes to interconnects 130 and vias 131 described above (though in different patterns).

In step 218, bond pads may be formed on the major planar surface 114 of the second semiconductor dies 112. As shown in FIGS. 3 and 5, these bond pads may include flip-chip bond pads 118. The bond pads 118 may match the bond pads 108 in pattern, size, pitch and number. The passivation layer 138 may be etched, and each bond pad 118 may be formed over a liner 117 in the etched regions of the passivation layer. The bond pads 118 and liner 117 may be formed of the same materials and in the same manner as bond pads 108 and liner 107 on the first semiconductor dies 102 described above. The integrated circuits 132 of the second semiconductor dies 112 may be electrically connected to the bond pads 118 by the metal interconnects 140 and vias 142.

FIG. 3 shows the second semiconductor dies 112 on wafer 110, and a grid pattern of bond pads 118 on one of the second semiconductor dies 112. The number of second semiconductor dies 112 shown on wafer 110 in FIG. 3 is for illustrative purposes, and wafer 110 may include more second semiconductor dies 112 than are shown in further embodiments. Similarly, the pattern of bond pads 118, as well as the number of bond pads 118, on the second semiconductor die 112 are shown for illustrative purposes. Each second die 112 may include more bond pads 118 than are shown in further embodiments, and may include various other patterns of bond pads 118, matching the pattern of bond pads 108 on first dies 102.

Figure 6:
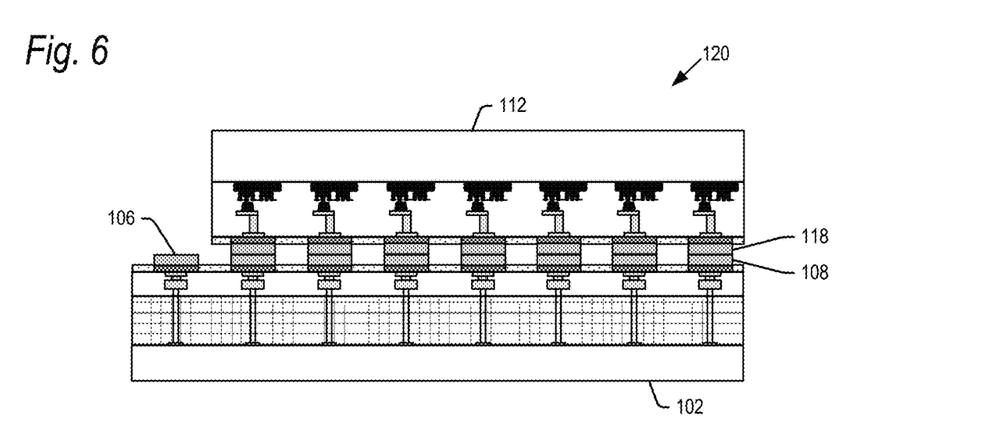
FIG. 6 is a cross-sectional edge view of a integrated memory module including a first semiconductor die bonded to a second semiconductor die according to embodiments of the present technology.

Once the fabrication of first and second semiconductor dies 102 and 112 is complete, the first and second semiconductor dies may be affixed to each other in step 222 to form an integrated memory module 120 as shown for example in the cross-sectional edge view of FIG. 6. In particular, the second semiconductor die 112 may be flipped over (relative to the views of FIGS. 3 and 5), and bond pads 108 and 118 of the respective dies 102 and 112 may be physically and electrically mounted to each other. In embodiments, the size of the second semiconductor dies 112 may be slightly smaller than the size of the first semiconductor dies 102. Thus, when the first and second dies are coupled together as shown in FIG. 6, the bond pads 106 on the first semiconductor dies remain uncovered and accessible from above.

The first and second semiconductor dies 102, 112 in the integrated memory module 120 may be bonded to each other by initially aligning the bond pads 108 and 118 on the respective dies 102, 112 with each other. Thereafter, the bond pads 108, 118 may be bonded together by any of a variety of bonding techniques, depending in part on bond pad size and bond pad spacing (i.e., bond pad pitch). The bond pad size and pitch may in turn be dictated by the number of electrical interconnections required between the first and second semiconductor dies 102 and 112.

Figure 7:
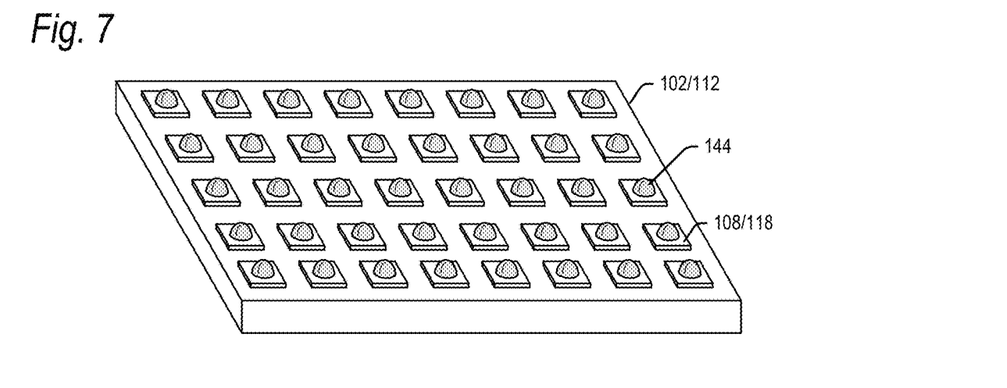
FIGS. 7-11 are perspective views showing various bond pad patterns on one of the first and second semiconductor die according to embodiments of the present technology.

In one embodiment shown in FIG. 7, one or both sets of bond pads 108, 118 on the first and second dies 102, 112 may include bumps 144 which adhere the first and second dies together using thermo-compression and/or ultrasonic bonding techniques. The bumps 144 may be solder, but may also be formed of Cu, Cu—Sn, Au, alloys thereof, or other metals and materials of relatively high melting points. In such embodiments, the bond pads may be about 70 μm square and spaced from each other with a pitch of 50 μm to 100 μm.

Figure 8:
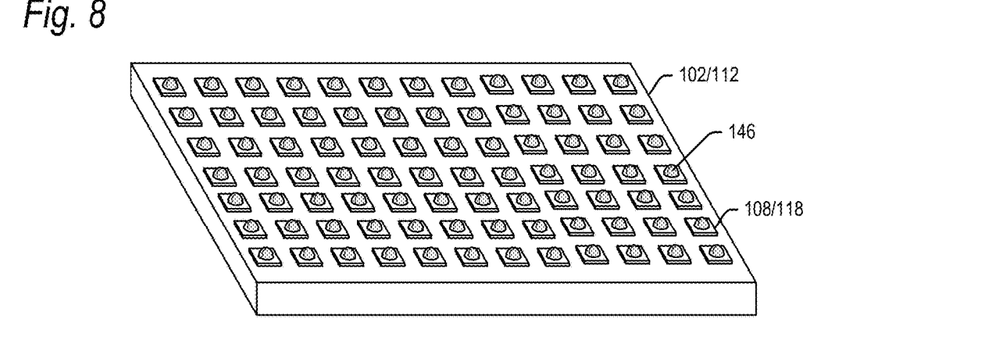

FIG. 8 shows a further embodiment using so-called micro-bumps 146 to bond pads 108 to pads 118. A small, controlled amount of solder, copper or other metal may be applied to bond pad 108 or to bond pad 118 of a pair of bond pads to be joined. The respective bond pads may be coupled to each other by micro-bumps 146 using for example thermo-compression. In such embodiments, the bond pads 108, 118 may be about 50 μm square and spaced from each other with a pitch of 30 μm to 50 μm.

Figure 9:
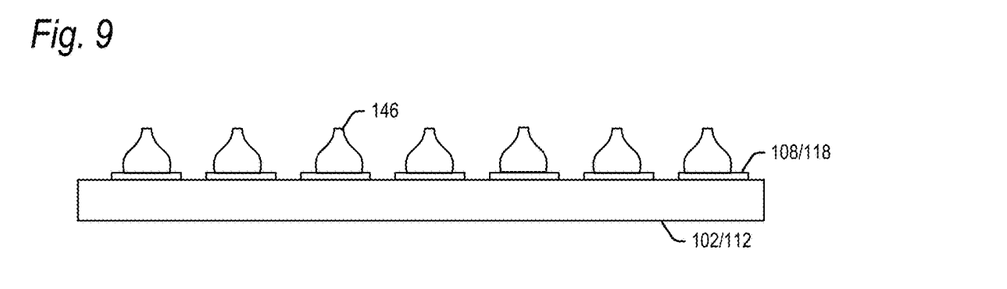

The applied micro-bumps 146 may be spherical or cylindrical. However, in a further embodiment shown in FIG. 9, the applied micro-bumps 146 may have a cone shape which has a wide base affixed to one of the bond pads 108, 118, and tapers to a narrow tip which may get bonded to the opposed bond pad using thermo-compression and/or ultrasonic bonding techniques. The cone-shaped bumps 146 may have straight (conical) sidewalls. Alternatively, the sidewalls may be concave near the base and transition to convex toward the tip, as shown in FIG. 9.

As explained below, in embodiments, the first semiconductor dies 102 may include only memory array circuits, and all supporting control circuitry may be off-loaded to the second dies 112. Such embodiments may have advantages, but require a large numbers of electrical interconnections between the first and second dies 102 and 112, including large numbers of bond pads 108 and 118. In one example, 100,000 or more interconnections may be required. In order to support such large numbers of electrical interconnections, the bond pads 108 and 118 may be provided with a small area and pitch. Such embodiments are shown and described for example with respect to FIGS. 10 and 11.

Figure 10:
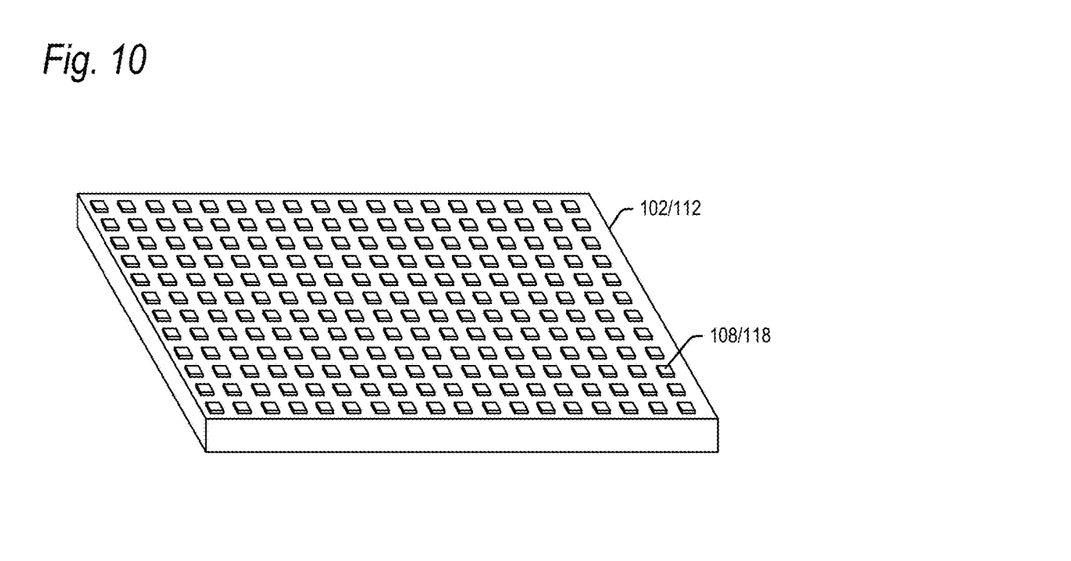
Figure 11:
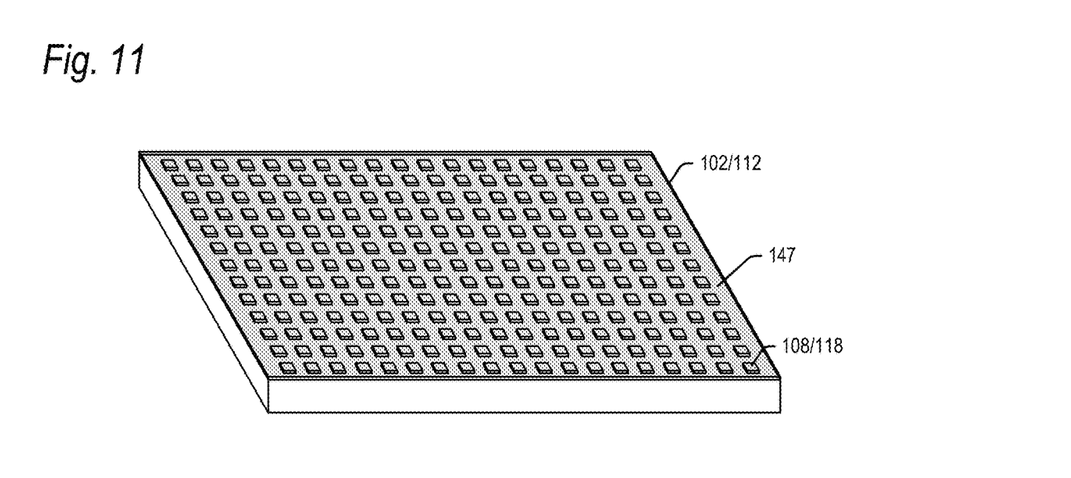

It is known to bond the bond pads 108, 118 directly to each other, without solder or other added material, in a so-called Cu-to-Cu bonding process. Such an example is shown in FIG. 10. In a Cu-to-Cu bonding process, the bond pads 108, 118 are controlled to be highly planar and formed in a highly controlled environment largely devoid of ambient particulates that might otherwise settle on a bond pad 108 and/or 118 and prevent a close bond. Under such properly controlled conditions, the bond pads 108, 118 are aligned and pressed against each other to form a mutual bond based on surface tension. Such bonds may be formed at room temperature, though heat may also be applied. In embodiments using Cu-to-Cu bonding, the bond pads 108, 118 may be about 5 μm square and spaced from each other with a pitch of 3 μm to 5 μm. While this process is referred to herein as Cu-to-Cu bonding, this term may also apply even where the bond pads 108, 118 are formed of materials other than Cu.

When the area of bond pads 108, 118 are small, it may be difficult to bond the first and second semiconductor dies 102, 112 together. The size of, and pitch between, bond pads 108, 118 may be further reduced by providing a film layer on the surfaces of the first dies 102 including the bond pads 108, and a film layer on the surface of the second dies 112 including the bond pads 118. Such an embodiment shown in FIG. 11. The film layer 147 is provided around the bond pads 108, 118. When the first and second dies 102, 112 are brought together, the bond pads 108, 118 may bond to each other, and the film layers 147 on the respective dies may bond to each other. Such a bonding technique may be referred to as hybrid bonding. In embodiments using hybrid bonding, the bond pads 108, 118 may be about 3 μm square and spaced from each other with a pitch of 1 μm to 5 μm. Bonding techniques may be used providing bond pads 108, 118 with you in smaller sizes and pitches.

As noted, once coupled to each other in step 222, the first semiconductor die 102 and the second semiconductor die 112 together form an integrated memory module 120. Examples of the integrated memory module 120 are shown in FIG. 6 described above, as well as in the edge and perspective views of FIGS. 12 and 13. As shown, once coupled together, the bond pads 106 may remain exposed to enable connection of the integrated memory module 120 to a host device or other components. The bond pads 106 may be formed as in any of the above-described embodiments of bond pads 108.

Figure 12:
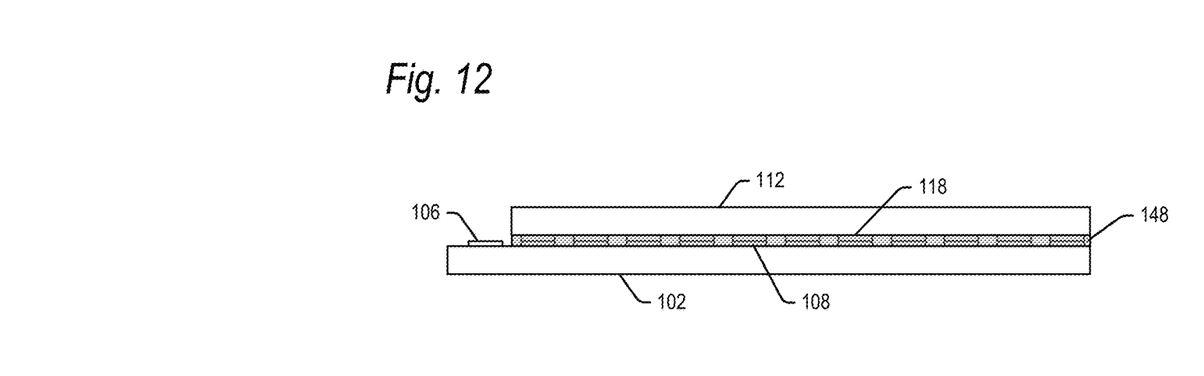
FIGS. 12 and 13 are edge and perspective views showing an integrated memory module according to embodiments of the present technology.
Figure 13:
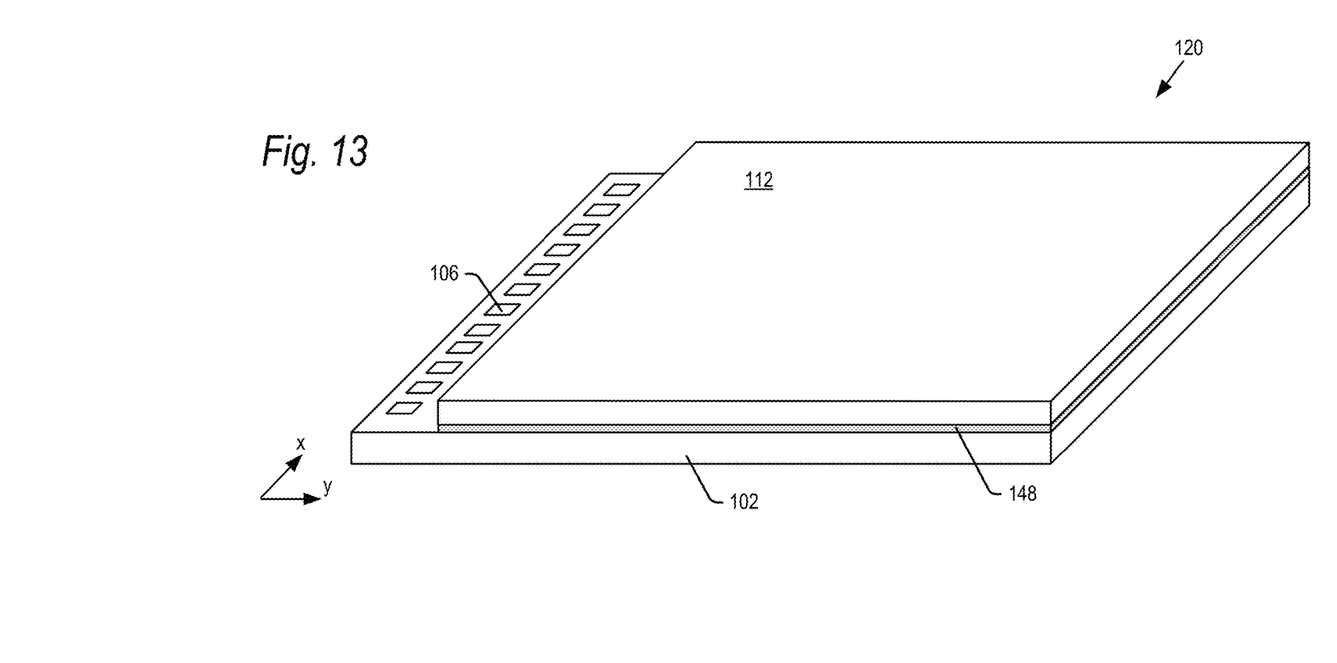

As noted above, some embodiments may include a film 147 (FIG. 11) on surface of the first and second dies 102, 112. Where no such film is initially provided, a space between the first and second dies may be under filled with an epoxy or other resin or polymer 148 (FIGS. 12 and 13). The under-fill material 148 may be applied as a liquid which then hardens into a solid layer. This under-fill step protects the electrical connections between the first and second dies 102, 112, and further secures the second die 112 onto the first die 102. Various materials may be used as under-fill material 148, but in embodiments, it may be Hysol epoxy resin from Henkel Corp., having offices in California, USA.

In accordance with aspects of the present technology, the integrated memory module 120 is a single, complete integrated flash memory, such as for example a BiCS flash memory. The flash memory is bifurcated into two separate semiconductor dies which are assembled together. Forming the integrated memory module 120 from separate semiconductor dies has several advantages over conventional flash memory dies formed on a single die. For example, where the first dies 102 includes memory cell arrays, removal of the logic circuit from the first dies frees up valuable space in each first die for additional memory cells. For example, where the memory cells are configured as a layered 3D memory stack, removal of the logic circuit allows additional layers to be provided in the memory stack.

Moreover, separation of the memory cells and the logic circuits into separate wafers allows the fabrication processes for the wafers to be customized and optimized for the particular integrated circuits formed on the respective wafers. For example, conventional processes for forming flash memory integrated circuits involve a heat step which could be detrimental to the CMOS logic circuits. By fabricating the logic circuits on their own wafer, this problem may be alleviated.

Figure 14:
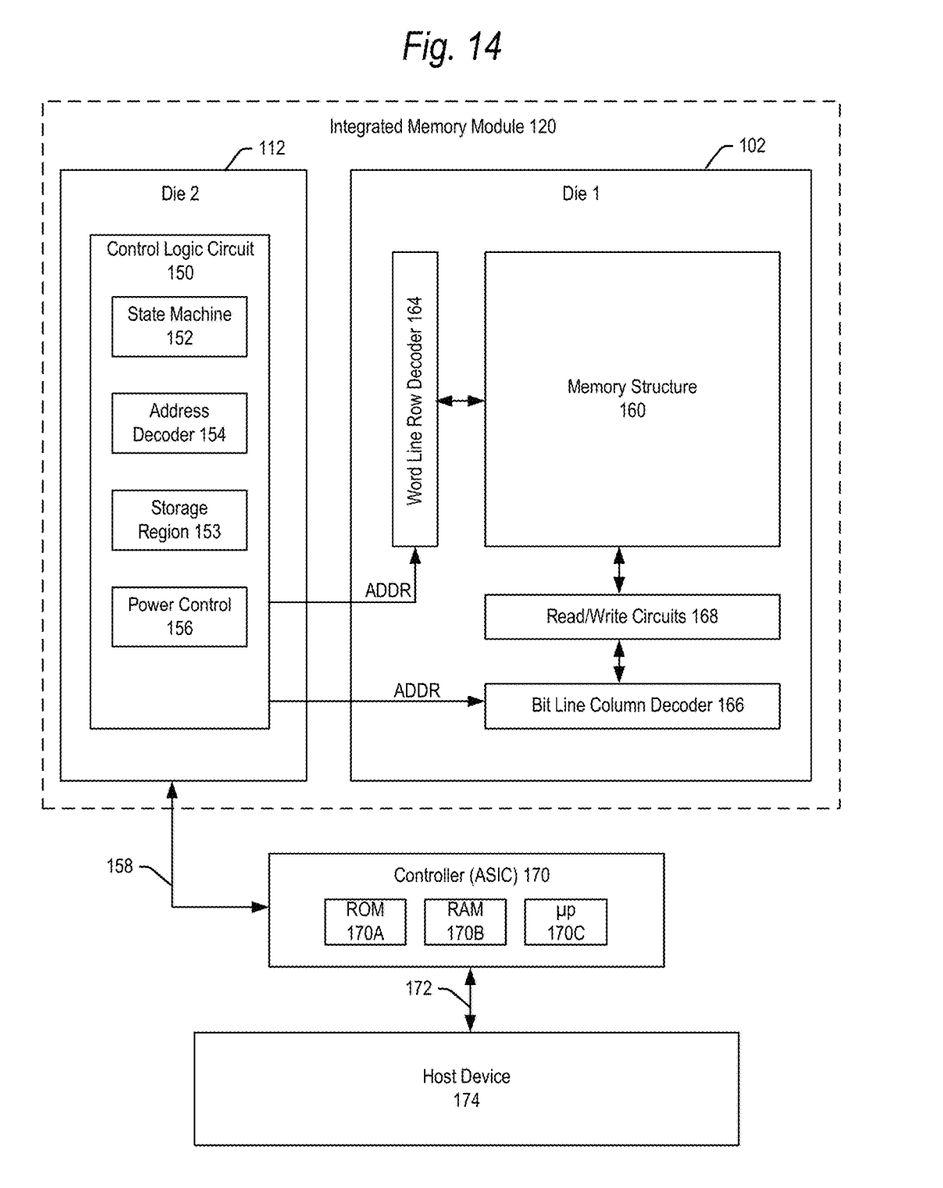
FIG. 14 is a functional block diagram of an integrated memory module coupled to a host device via a controller according to embodiments of the present technology.

FIG. 14 is a functional block diagram showing further detail of an embodiment where the first semiconductor die 102 includes memory cell arrays and the second semiconductor die 112 includes a logic circuit. The first die 102 of the integrated memory module 120 may include a memory structure 160 of memory cells, such as an array of memory cells, and read/write circuits 168. The second die 112 may include control logic circuitry 150. The memory structure 160 is addressable by word lines via a row decoder 164 and by bit lines via a column decoder 166. The read/write circuits 168 may include multiple sense blocks (sensing circuitry) that allow a page of memory cells to be read or programmed in parallel.

Multiple memory elements in memory structure 160 may be configured so that they are connected in series or so that each element is individually accessible. By way of non-limiting example, flash memory systems in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements of memory structure 160 may be configured so that each element is individually accessible, e.g., a NOR memory array. NAND and NOR memory configurations are exemplary, and memory elements may be otherwise configured.

The memory structure 160 can be two-dimensional (2D) or three-dimensional (3D). The memory structure 160 may comprise one or more arrays of memory elements (also referred to as memory cells). A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major planar surface of the first semiconductor die 102).

The memory structure 160 on the first die 102 may be controlled by control logic circuit 150 on the second die 112. The control logic circuit 150 may have circuitry used for controlling and driving memory elements to accomplish functions such as programming and reading. The control circuitry 150 cooperates with the read/write circuits 168 to perform memory operations on the memory structure 160. In embodiments, control circuitry 150 may include a state machine 152, an on-chip address decoder 154, and a power control module 156. The state machine 152 provides chip-level control of memory operations. A storage region 153 may be provided for operating the memory structure 160 such as programming parameters for different rows or other groups of memory cells. These programming parameters could include bit line voltages and verify voltages.

The on-chip address decoder 154 provides an address interface between that used by the host device or the memory controller (explained below) to the hardware address used by the decoders 164 and 166. The power control module 156 controls the power and voltages supplied to the word lines and bit lines during memory operations. It can include drivers for word line layers in a 3D configuration, source side select gates, drain side select gates and source lines. A source side select gate is a gate transistor at a source-end of a NAND string, and a drain side select gate is a transistor at a drain-end of a NAND string.

In accordance with aspects of the present technology, the above-described components of integrated memory module 120 are bifurcated into two separate semiconductor dies 102 and 112, one example of which dies 102, 112 are shown in FIG. 14. However, it is understood that the division of the above-described components between the two different dies 102, 112 may vary from that shown in FIG. 14. Some or all of the components shown and described above as being part of die 102 may be provided on die 112, while some or all of the components shown and described above as being part of die 112 may be provided on die 102. Additional components may be added to either die 102 or die 112 in further embodiments. In embodiments, the control logic circuit 150 may include the components shown in FIG. 14 and described above. In further embodiments, all components other than the memory cells 160 can be thought of as one or more control logic circuits which are configured to perform the actions described herein. For example, one or more control logic circuits may include any one of, or a combination of, control circuitry 150, state machine 152, decoders 154/164/166, power control module 156, the sense blocks of read/write circuits and so forth.

Data and commands may be transferred to and from the integrated memory module 120 by a memory controller 170. The memory controller 170 may for example comprise an ASIC, and may be processed on a semiconductor die that is separate from dies 102 and 112. In further embodiments, the memory controller 170 may be incorporated into one of the dies 102, 112, such as for example on the second semiconductor die 112. The memory controller 170 may comprise a processor such as a microprocessor 170c, and storage devices (memory) such as read only memory (ROM) 170a and RAM 170b. RAM 170b may be, but is not limited to, SRAM and DRAM. The storage devices comprise code such as a set of instructions, and the processor is operable to execute the set of instructions to provide the functionality described herein. Alternatively or additionally, the processor can access code from a storage device region of the memory structure 160, such as a reserved area of memory cells in one or more word lines.

The code is used by the memory controller 170 to access the memory structure 160 such as for programming, read and erase operations. The code can include boot code and control code (e.g., a set of instructions). The boot code is software that initializes the memory controller 170 during a booting or startup process and enables the memory controller to access the memory structure 160. Upon being powered up, the processor 170c fetches the boot code from the ROM 170a or the storage device region of memory structure 160 for execution, and the boot code initializes the system components and loads the control code into the RAM 170b. Once the control code is loaded into the RAM 170b, it is executed by the processor 170c. The control code includes drivers to perform basic tasks such as controlling and allocating memory, prioritizing the processing of instructions, and controlling input and output ports.

The memory controller 170 controls communication between the integrated memory module 120 and a host device 174. The host device may for example be a printed circuit board to which the integrated memory module 120 and/or memory controller 162 are mounted. The host device may alternatively be a computing system. Commands and data are transferred between the host device 174 and memory controller 170 via an interface (e.g., data bus) 172 and between the memory controller and the integrated memory module 120 via line 158. The interface 172 between the host device 174 and the memory controller 170 may comprise a Peripheral Component Interconnect Express (PCIe) bus, but the interface 172 is not limited to a PCIe bus.

Referring again to FIG. 1, after the first and second dies 102, 112 are formed and coupled to each other to form integrated memory module 120, the memory module 120 may be tested in step 226 as is known, for example with read/write and burn in operations. Thereafter, the integrated memory module 120 may be packaged into a semiconductor device, possibly including multiple integrated memory modules 120. While a wide variety of packaging configurations are known, FIG. 15 shows one such example.

Figure 15:
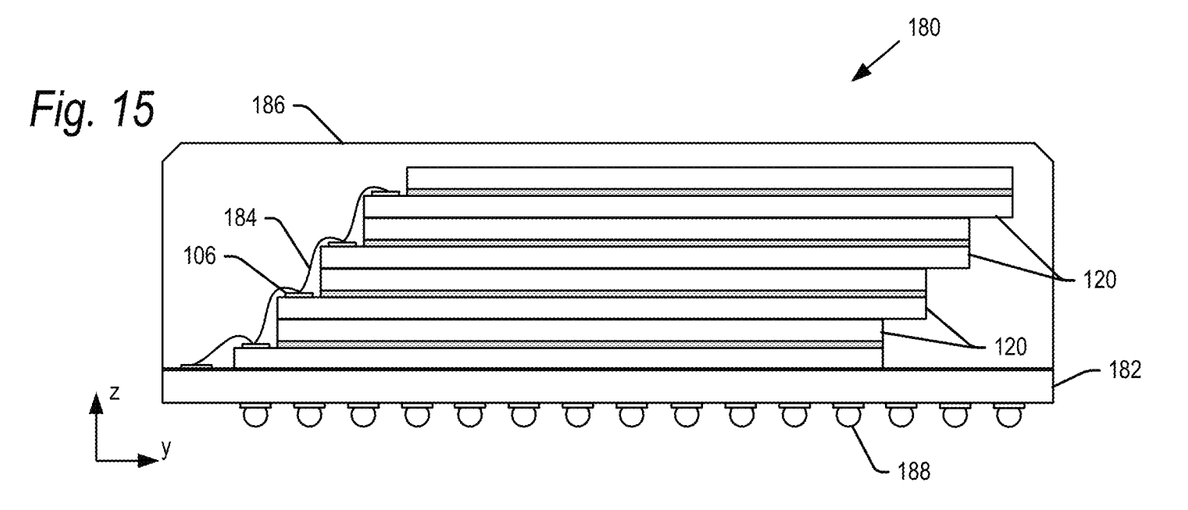
FIG. 15 is an example of a semiconductor device including a number of stacked integrated memory modules according to embodiments of the present technology.

FIG. 15 shows a semiconductor device 180 including a number of integrated memory modules 120 stacked on each other and a substrate 182, for example using a die attach film (DAF) on a bottom surface of the first semiconductor dies 102 of each module 120. The integrated memory modules 120 may for example be stacked with a stepped offset, leaving the bond pads 106 at each level uncovered and accessible from above. The integrated memory modules 120 may be wire bonded to each other and the substrate 182 using wire bonds 184 affixed to the bond pads 106 at each level. A number of such wire bonds may be formed across the width of each integrated memory module 120 (i.e., into the page of FIG. 15). The semiconductor device 180 may be encapsulated in a mold compound 186 to encase and protect the various dies 102 and 112 as well as wire bonds 184.

Solder balls 188 may optionally be affixed to contact pads on a lower surface of substrate 182 of the semiconductor device 180. The solder balls 188 may be used to electrically and mechanically couple the semiconductor device 180 to a host device 174 (FIG. 14) such as a printed circuit board. Solder balls 188 may be omitted where the semiconductor device 180 is to be used as an LGA package.

Figure 16:
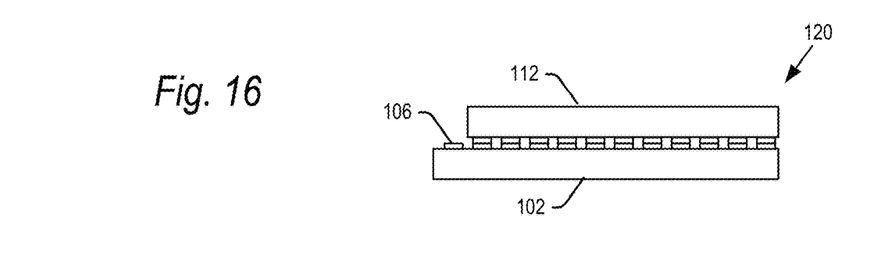
FIG. 16 is an edge view of a first semiconductor die bonded to a second semiconductor die after being diced from their respective semiconductor wafers.
Figure 17:
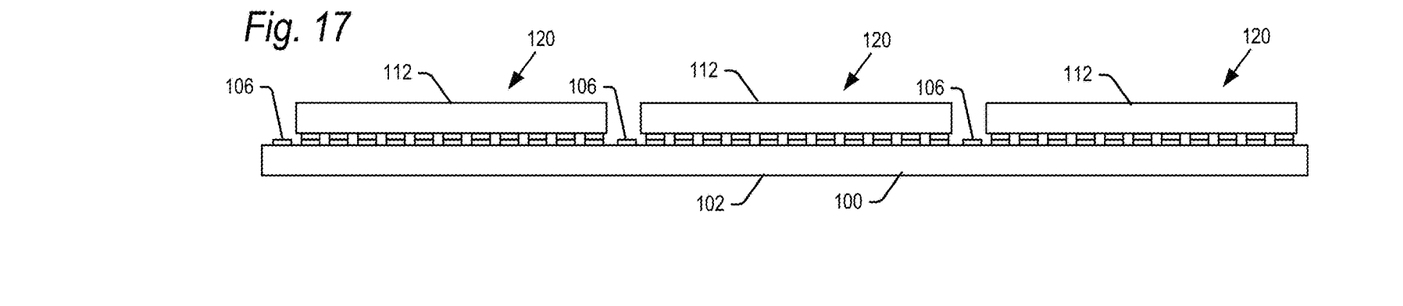
FIG. 17 is an edge view of a number of second semiconductor dies bonded to a wafer of one or more first semiconductor dies.

In embodiments of the present technology, the first and second dies 102, 112 may both be diced from the first and second wafers 100, 110 before the dies 102, 112 are coupled together. Such an embodiment is shown for example in FIG. 16. In further embodiments, individual second semiconductor dies 112 may be diced from wafer 110 and mounted on a first wafer 100 of (undiced) first dies 102. Such an embodiment is shown in FIG. 17. The first wafer 100 in this embodiment may then be diced into multiple integrated memory modules 120, or used as a single integrated memory module 120 having multiple second semiconductor dies 112 on the surface of wafer 100.

As noted, in some embodiments, a large number of electrical interconnections may be provided between first and second dies, which may be accomplished by a small bond pad 108, 118 size and pitch. Additionally or alternatively, one or both of the first and second semiconductor dies 102, 112 may be made unconventionally large. As one example, a wafer 100 may have one large semiconductor die 102, or a wafer 110 may have one large semiconductor die 112. Thus, in the embodiment of FIG. 17, the undiced wafer 100 may comprise many first dies 102, or a single die 102. Wafers 100 and 110 may have other numbers of large dies, such as 2, 3, 4, 5, 6, 7, 8, etc. dies.

Figure 18:
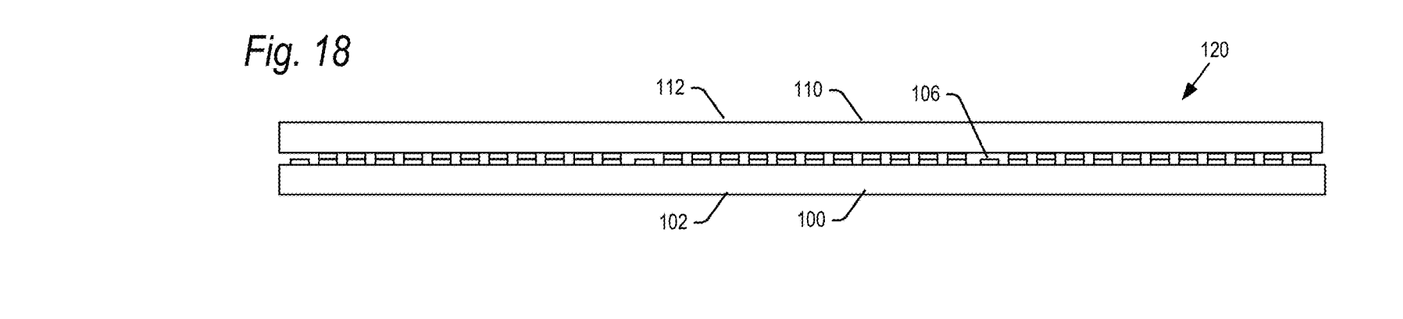
FIG. 18 is an edge view of a second wafer having one or more second semiconductor dies bonded on to a first wafer having one or more first semiconductor dies.

In a further embodiment, an undiced second wafer 110 of one or more second semiconductor dies may be mounted on top of an undiced first wafer 100 of one or more first semiconductor dies 102. Such an embodiment is shown in FIG. 18. The first and second wafers 100, 110 in this embodiment may then be diced into multiple integrated memory modules 120. Alternatively, the first and second wafers may be used as a single integrated memory module 120. Vias may be formed through the wafer 110 to allow access and external connection to bond pads 106.

In embodiments described above, the first semiconductor dies 102 are larger than the second semiconductor dies 112 and include an extra row of bond pads 106 that remain uncovered when the first and second dies 102 and 112 are coupled. In a further embodiment, the second semiconductor dies 112 may be larger than the first semiconductor dies 102 and may include the extra row of bond pads 106 that remain uncovered when the first and second dies 102 and 112 are coupled. Such an embodiment is shown in the cross-sectional edge view of FIG. 19.

Figure 19:
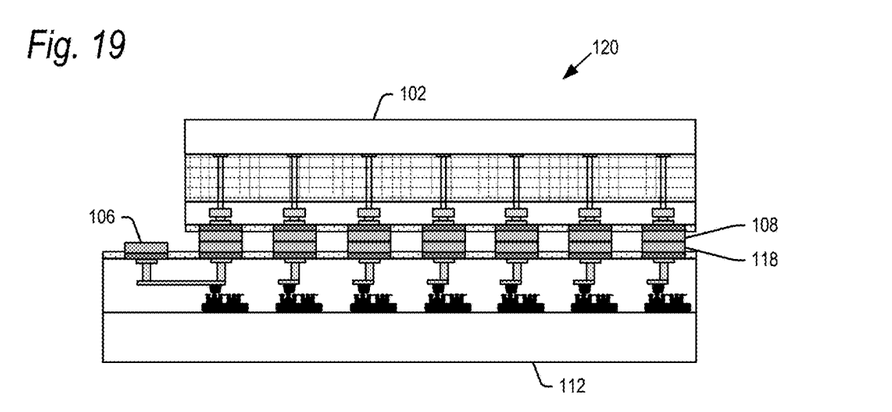
FIG. 19 is a cross-sectional edge view where the external connector bond pad is provided as part of the second semiconductor die.
Figure 20:
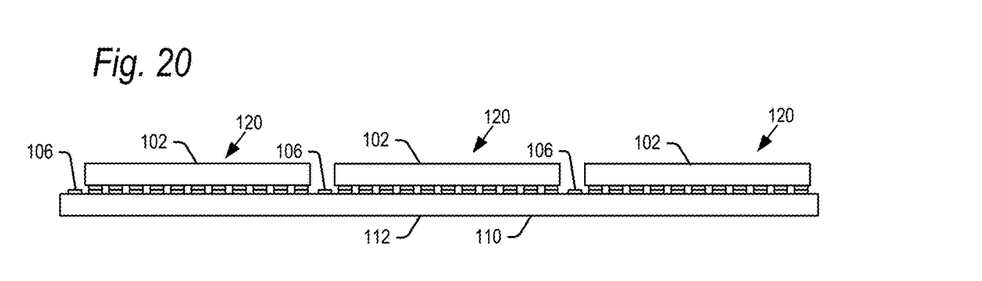
FIG. 20 is an edge view of a number of first semiconductor dies bonded to a wafer of one or more second semiconductor dies.

In embodiments, the first and second dies 102, 112 of FIG. 19 may both be diced from the first and second wafers 100, 110 before the dies 102, 112 are coupled together. In further embodiments, individual first semiconductor dies 102 may be diced from wafer 100 and mounted on a second wafer 110 having a large number of smaller second dies 112, or one or a few larger second dies 112. Such an embodiment is shown in FIG. 20. The second wafer 110 in this embodiment may then be diced into multiple integrated memory modules 120, or used as a single integrated memory module 120 having multiple first semiconductor dies 102 on the surface of wafer 110.

Figure 21:
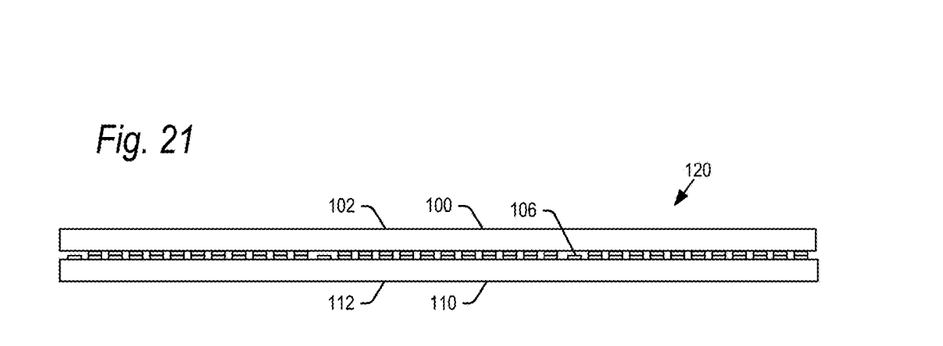
FIG. 21 is an edge view of a first wafer having one or more first semiconductor dies bonded on to a second wafer having one or more second semiconductor dies.

In a further embodiment, an undiced first wafer 100 of one or more first semiconductor dies 102 may be mounted on top of an undiced second wafer 110 of one or more second semiconductor dies 112. Such an embodiment is shown in FIG. 21. The first and second wafers 100, 110 in this embodiment may then be diced into multiple integrated memory modules 120. Alternatively, the first and second wafers may be used as a single integrated memory module 120. Vias may be formed through the wafer 100 to allow access and external connection to bond pads 106.

In the embodiments described above, the first and second semiconductor dies 102, 112 include a pattern of bond pads for flip-chip bonding of the dies, and a row of bond pads 106 enabling external connection of the integrated memory module 120 to a host device. It is understood that the first and second semiconductor dies 102, 112 may be electrically coupled to each other using other schemes, and/or that the integrated memory module 120 may be externally connected using other schemes, in further embodiments.

Figure 22:
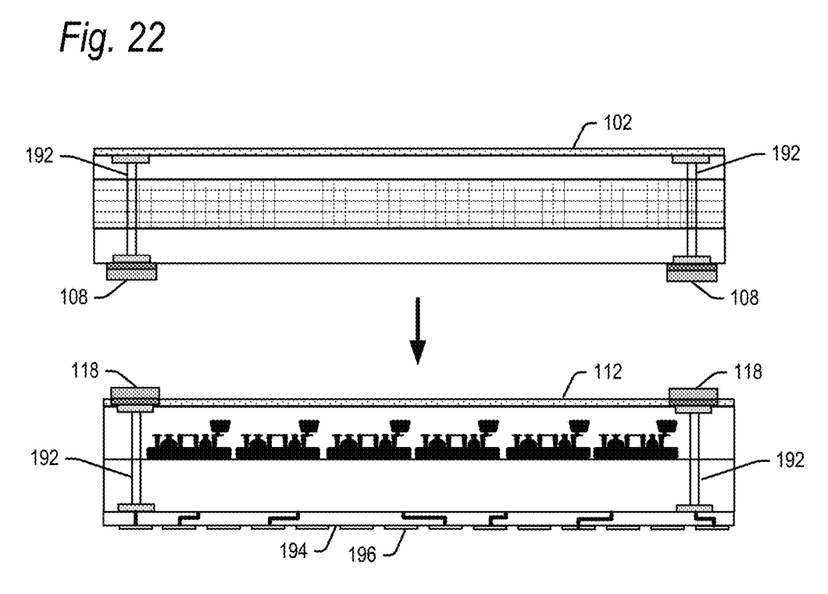
FIGS. 22 and 23 are cross-sectional edge views of a semiconductor device including an integrated memory module according to an alternative embodiment of the present technology.
Figure 23:
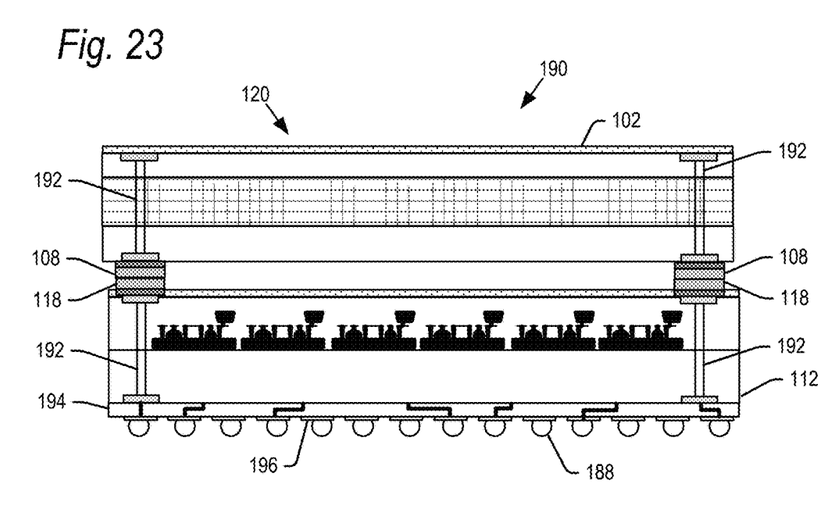

One such further embodiment will now be descried with reference to the cross-sectional edge views of FIGS. 22 and 23, which show a semiconductor device 190 in which the first and second semiconductor dies 102, 112 may be electrically coupled to each other using through-silicon vias (TSV) 192. Before, during or after formation of the of the integrated circuits in the first and second semiconductor dies 102, 112, a pattern of TSVs 192 may be formed extending between the top and bottom major planar surfaces of the first and second wafers 100, 110. The TSVs 192 may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

The bond pads 108, 118 may then be formed over the TSVs 192 as explained above. The pattern of TSVs 192, and bond pads 108, 118 thereon, may match each other in the first and second semiconductor dies 102, 112. The second semiconductor die 112 may then be flipped over, and the bond pads 108 and 118 may be coupled to each other by any of the above-described methods to form an integrated memory module 120 as shown in FIG. 23. A redistribution layer (RDL) 194 may be formed on a major planar surface of one of the first and second die 102, 112, such as for example second die 112. The RDL 194 may electrically redistribute the patterns of TSVs 192 to a pattern of pads 196 on a bottom surface of the RDL 194. Solder balls 188 may be mounted on the pads 196 to allow the exchange of signals and voltages between the semiconductor device 190 and a host device to which the solder balls 188 are coupled.

In the embodiment of FIGS. 22 and 23, the first and second semiconductor dies 102 and 112 may be the same size as each other. The first and second dies 102, 112 may be mounted to each other after being diced from wafers 100, 110, after one has been diced and the other is still part of its wafer 100 or 110, or while both are still part of their respective wafers 100 and 110.

In summary, an example of the present technology relates to an integrated memory module comprising: a first semiconductor die comprising a first group of bond pads and a second group of bond pads; a second semiconductor comprising a third group of bond pads flip-chip bonded the first group of bond pads of the first semiconductor die to electrically and physically couple the second semiconductor die to the first semiconductor die; wherein the first and second coupled semiconductor dies together are configured as an integrated flash memory.

In another example, the present technology relates to an integrated memory module comprising: a first semiconductor die comprising: a plurality of memory cells, a first group of bond pads electrically coupled to the plurality of memory cells, and a second group of bond pads; a second semiconductor comprising: control circuits for controlling access to the plurality of memory cells on the first semiconductor die, and a third group of bond pads flip-chip bonded the first group of bond pads of the first semiconductor die to electrically and physically couple the second semiconductor die to the first semiconductor die; wherein the first and second coupled semiconductor dies together are configured as an integrated flash memory.

In a further example, the present technology relates to a method of fabricating a semiconductor device, comprising: (a) forming a first plurality of bond pads on a first semiconductor die; (b) forming a second plurality of bond pads on a second semiconductor die; and (c) mounting at least some of the first plurality of bond pads to the second plurality of bond pads, the first semiconductor die and the second semiconductor die together being configured as an integrated flash memory.

In another example, the present technology relates to an integrated memory module comprising: a first semiconductor die comprising first bond pad means for electrically connecting the first semiconductor die, and second bond pad means for electrically connecting the first semiconductor die; a second semiconductor comprising third bond pads means for flip-chip bonding to the first bond pad means; wherein the first and second coupled semiconductor dies together are configured as an integrated flash memory.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An integrated memory module comprising:
   a first semiconductor die comprising a first group of bond pads and a second group of bond pads;
   a second semiconductor comprising a third group of bond pads flip-chip bonded to the first group of bond pads of the first semiconductor die to electrically and physically couple the second semiconductor die to the first semiconductor die;
   wherein the first and second coupled semiconductor dies together are configured as an integrated flash memory.

2. The integrated memory module of claim 1, wherein the first semiconductor die comprises a plurality of memory cells.

3. The integrated memory module of claim 2, wherein the second semiconductor die comprises a control circuit for controlling access to the plurality of memory cells.

4. The integrated memory module of claim 3, wherein the control circuit comprises a complementary metal-oxide-semiconductor integrated circuit.

5. The integrated memory module of claim 1, wherein the second group of bond pads on the first semiconductor die are configured to receive electrical connectors for electrically connecting the integrated memory module to a host device.

6. The integrated memory module of claim 1, wherein the second group of bond pads on the first semiconductor die are configured to receive wire bonds for electrically connecting the integrated memory module to a host device.

7. An integrated memory module comprising:
a first semiconductor die comprising:
a plurality of memory cells,
a first group of bond pads electrically coupled to the plurality of memory cells, and
a second group of bond pads;
a second semiconductor comprising:
control circuits for controlling access to the plurality of memory cells on the first semiconductor die, and
a third group of bond pads flip-chip bonded the first group of bond pads of the first semiconductor die to electrically and physically couple the second semiconductor die to the first semiconductor die;
wherein the first and second coupled semiconductor dies together are configured as an integrated flash memory.

8. The integrated memory module of claim 7, wherein the number of bond pads in the third group coupled to the bond pads in the first group comprise between 100 and 1,000.

9. The integrated memory module of claim 7, wherein the number of bond pads in the third group coupled to the bond pads in the first group comprise between 10,000 and 100,000.

10. The integrated memory module of claim 7, wherein the control circuits comprises a complementary metal-oxide-semiconductor integrated circuit.

11. The integrated memory module of claim 7, wherein the second group of bond pads on the first semiconductor die are configured to receive electrical connectors for electrically connecting the integrated memory module to a host device.

12. The integrated memory module of claim 1, wherein the second group of bond pads on the first semiconductor die are configured to receive wire bonds for electrically connecting the integrated memory module to a host device.

13. A method of fabricating a semiconductor device, comprising:
(a) forming a first plurality of bond pads on a first semiconductor die;
(b) forming a second plurality of bond pads on a second semiconductor die; and
(c) mounting at least some of the first plurality of bond pads to the second plurality of bond pads, the first semiconductor die and the second semiconductor die together being configured as an integrated flash memory.

14. The method of claim 13, wherein said step (c) of mounting at least some of the first plurality of bond pads to the second plurality of bond pads comprises mounting the at least some of the first plurality of bond pads to the second plurality of bond pads after the first semiconductor die and the second semiconductor die have been diced from a wafer.

15. The method of claim 13, wherein said step (c) of mounting at least some of the first plurality of bond pads to the second plurality of bond pads comprises mounting the at least some of the first plurality of bond pads to the second plurality of bond pads after the first semiconductor die has been severed from a wafer and before the second semiconductor die has been severed from the wafer.

16. The method of claim 13, wherein said step (c) of mounting at least some of the first plurality of bond pads to the second plurality of bond pads comprises mounting the at least some of the first plurality of bond pads to the second plurality of bond pads before the first semiconductor die has been severed from a wafer and before the second semiconductor die has been severed from a wafer.

17. The method of claim 13, wherein said step (c) of mounting at least some of the first plurality of bond pads to the second plurality of bond pads comprises applying solder to a pair of bond pads to be connected to each other and melting the solder using thermo-compression.

18. The method of claim 17, wherein said step (c) of mounting at least some of the first plurality of bond pads to the second plurality of bond pads comprises applying solder to a pair of bond pads to be connected to each other and melting the solder using ultrasonic bonding.

19. The method of claim 13, wherein said step (c) of mounting at least some of the first plurality of bond pads to the second plurality of bond pads comprises applying a micro-bump to one bond pad of a pair of bond pads to be connected to each other, and melting the micro-bump using thermo-compression.

20. The method of claim 13, wherein said step (c) of mounting at least some of the first plurality of bond pads to the second plurality of bond pads comprises a Cu-to-Cu bonding bringing the pair of bond pads together under pressure.

21. An integrated memory module comprising:
a first semiconductor die comprising first bond pad means for electrically connecting the first semiconductor die, and second bond pad means for electrically connecting the first semiconductor die;
a second semiconductor comprising third bond pads means for flip-chip bonding to the first bond pad means;
wherein the first and second coupled semiconductor dies together are configured as an integrated flash memory.

* * * * *